(12) United States Patent
Warrick et al.

(10) Patent No.: US 7,948,607 B2
(45) Date of Patent: May 24, 2011

(54) IMMERSION LITHOGRAPHY APPARATUS AND METHOD OF PERFORMING IMMERSION LITHOGRAPHY

(75) Inventors: Scott Warrick, Crolles (FR); Kevin Cooper, Weatherford, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 57 days.

(21) Appl. No.: 12/158,392

(22) PCT Filed: Dec. 22, 2005

(86) PCT No.: PCT/EP2005/014216
§ 371 (c)(1),
(2), (4) Date: Jun. 20, 2008

(87) PCT Pub. No.: WO2007/071280
PCT Pub. Date: Jun. 28, 2007

(65) Prior Publication Data
US 2009/0002654 A1    Jan. 1, 2009

(51) Int. Cl.
*G03B 27/42* (2006.01)
*G03B 27/52* (2006.01)

(52) U.S. Cl. .......................... 355/53; 355/30

(58) Field of Classification Search ............ 355/30, 355/53, 77; 250/548
See application file for complete search history.

(56) References Cited

U.S. PATENT DOCUMENTS

| | | | |
|---|---|---|---|
| 6,954,256 B2 * | 10/2005 | Flagello et al. | 355/53 |
| 7,317,507 B2 * | 1/2008 | Straaijer | 355/53 |
| 2003/0107184 A1 | 6/2003 | Platner | |
| 2004/0038060 A1 | 2/2004 | Kawakami et al. | |
| 2005/0094116 A1 | 5/2005 | Flagello et al. | |
| 2005/0094119 A1 | 5/2005 | Loopstra et al. | |
| 2005/0122505 A1 | 6/2005 | Miyajima | |
| 2005/0168713 A1 | 8/2005 | Vogel et al. | |
| 2008/0304026 A1 * | 12/2008 | Yamashita | 355/30 |

FOREIGN PATENT DOCUMENTS

| | | |
|---|---|---|
| EP | 1816671 A1 | 8/2007 |
| EP | 1494079 B1 | 1/2008 |
| EP | 1571698 A1 | 6/2008 |

* cited by examiner

*Primary Examiner* — Hung Henry Nguyen

(57) ABSTRACT

An immersion lithography apparatus includes an optical system having a liquid delivery unit. The liquid delivery unit is arranged to deliver a layer of an immersion liquid onto a surface of a wafer as well as an annulus of a barrier liquid adjacent an exterior wall of the immersion liquid. The presence of the barrier liquid prevents ingress to the immersion liquid of a gas external to the immersion liquid.

20 Claims, 2 Drawing Sheets

IMMERSION LITHOGRAPHY APPARATUS AND METHOD OF PERFORMING IMMERSION LITHOGRAPHY

FIELD OF THE INVENTION

This invention relates to an immersion lithography apparatus of the type, for example, that projects a pattern through an immersion liquid onto a wafer. This invention also relates to a method of performing immersion lithography of the type, for example, that projects a pattern through an immersion liquid onto a wafer.

BACKGROUND OF THE INVENTION

In the field of semiconductor processing, photolithography is a widely employed technique to "pattern", i.e. define a profile in one or more layer of semiconductor material, a semiconductor wafer. Using this technique, hundreds of Integrated Circuits (ICs) formed from an even larger number of transistors can be formed on a wafer of silicon. In this respect, for each wafer, the ICs are formed one at a time and on a layer-by-layer basis.

For about the last four decades, a photolithography apparatus, sometimes known as a cluster or photolithography tool, has been employed to carry out a photolithographic process. The cluster comprises a track unit that prepares the wafer, including providing layers of photosensitive material on the surface of the wafer prior to exposure to a patterned light source. To expose the wafer to the patterned light source, the wafer is transferred to an optics unit that is also part of the cluster. The patterned light source is generated by passing a beam of light through a chrome-covered mask, the chrome having been patterned with an image of a given layer of an IC to be formed, for example, transistor contacts. Thereafter, the wafer is returned to the track unit for subsequent processing including development of the layers of photosensitive material mentioned above.

The wafer, carrying the layers of photosensitive material, is supported by a movable stage. A projection lens focuses the light passing through the mask to form an image on a first field over the layers of photosensitive material where an IC is to be formed, exposing the field of the layers of photosensitive material to the image and hence "recording" the pattern projected through the mask. The image is then projected on another field over the layers of photosensitive material where another IC is to be formed, this field over the layers of photosensitive material being exposed to the projected image, and hence pattern.

The above process is repeated for other fields where other ICs are to be formed. Thereafter, the wafer is, as mentioned above, returned to the track unit, and the exposed layers of photosensitive material, which become soluble or insoluble through exposure depending upon the photosensitive materials used, are developed to leave a "photoresist" pattern corresponding to a negative (or positive) of the image of a layer of one or more ICs to be created. After development, the wafer undergoes various other processes, for example ion implantation, etching or deposition. The remaining layers of photosensitive material are then removed and fresh layers of photosensitive material are subsequently provided on the surface of the wafer depending upon particular application requirements for patterning another layer of the one or more ICs to be formed.

In relation to the patterning process, the resolution of a photolithography apparatus, or scanner, impacts upon the width of wires and spaces therebetween that can be "printed", the resolution being dependent upon the wavelength of the light used and inversely proportional to a so-called "numerical aperture" of the scanner. Consequently, to be able to define very high levels of detail a short wavelength of light is required and/or a large numerical aperture.

The numerical aperture of the scanner is dependent upon the product of two parameters. A first parameter is the widest angle through which light passing through the lens can be focused on the wafer, and a second parameter is the refractive index of the medium through which the light passes when exposing the layers of photosensitive material on the wafer.

Indeed, to provide the increased resolution demanded by the semiconductor industry, it is known to reduce wavelengths of light used whilst also making lenses bigger to increase the numerical aperture. However, practical limits to the usable wavelengths of light are currently being reached, for example due to cost of having to use lenses formed from different materials compatible with the lower wavelengths of light, and scarcity of suitable lens materials.

Additionally, the above-described scanner operates in air, air having a refractive index of 1, resulting in the scanner having a numerical aperture between 0 and 1. Since the numerical aperture needs to be as large as possible, and the amount the wavelength of light can be reduced is limited, an improvement to the resolution of the scanner has been proposed that, other than by increasing the size of the lens, uses the scanner in conjunction with a medium having a refractive index greater than that of air, i.e. greater than 1. In this respect, the more recent photolithographic technique proposed, employing water and known as immersion lithography, can achieve higher levels of device integration than can be achieved by air-based photolithography techniques.

Therefore, scanners employing this improvement (immersion scanners) continue to use low wavelengths of light, but the water provides a refractive index of approximately 1.4 at a wavelength of 193 nm between the lens and the wafer, thereby achieving increased depth of focus and effectively increasing the numerical apertures of the immersion lithographic apparatus.

Further, the refractive index of the water is very close to that of quartz from which some lenses are formed, resulting in reduced refraction at the interface between the lens and the water. The reduced refraction allows the size of the lens to be increased, thereby allowing advantage to be taken of the higher available numerical aperture.

However, with the introduction of immersing lithography come technical challenges to be overcome if immersion lithography is to be a viable lithographic technique for defining sub-45 nm features.

One known immersion lithography apparatus comprises an illumination system to serve as a source of electromagnetic radiation. The illumination system is coupled to a support structure for holding a mask, the support structure being coupled to a first translation apparatus to position the illumination system accurately. A wafer table is disposed beneath the illumination system and is coupled to a second translation apparatus to position accurately the wafer table. A projection system is disposed adjacent the wafer table and projects light from the illumination system onto a wafer located on the wafer table. The projection system comprises an immersion head, which when in use, delivers and maintains an immersion liquid between the immersion head and the wafer.

In operation, the immersion lithography apparatus has a scan mode in which the wafer table is synchronously translated relative to the support structure, the immersion liquid having a leading edge corresponding to a direction of travel of the immersion liquid.

In order to increase wafer yields in connection with photolithographic processing of wafers, it is desirable to increase a velocity of translation of the wafer table relative to the support structure, i.e. to take less time to pattern the wafer. However, as scan rates increase to about 350 mms$^{-1}$, it has been found that the leading edge of the immersion liquid rolls under the immersion liquid causing bubbles to form in the immersion liquid, which are then printed. Indeed, bubbles are known to be a significant hindrance to successful implementation of the immersion lithography technique. One known solution is to limit the scan rate, but this, of course, impacts negatively upon the achievable wafer yields.

Additionally, it is becoming desirable to use so-called "high n", or high refractive index liquids as the immersion liquid. However, high n liquids need to be used in an oxygen-free environment, otherwise the refractive index of the high n begins to change rapidly. Further, due to the relative expense of high n liquids, the high n liquid is likely to be recycled in a closed system.

STATEMENT OF INVENTION

According to the present invention, there is provided an immersion lithography apparatus and a method of performing immersion lithography as set forth in the appended claims.

BRIEF DESCRIPTION OF THE DRAWINGS

At least one embodiment of the invention will now be described, by way of example only, with reference to the accompanying drawings, in which.

DESCRIPTION OF PREFERRED EMBODIMENTS

Figure 1:
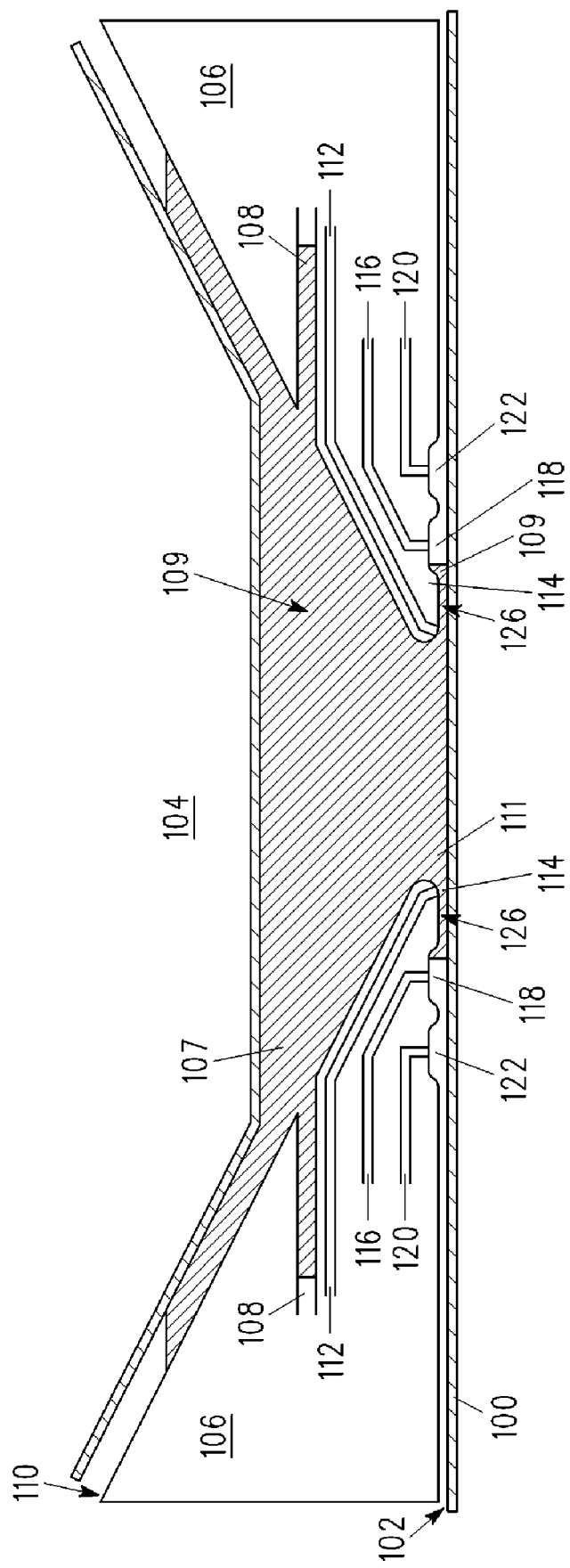
FIG. 1 is a schematic diagram of a liquid delivery unit of an immersion lithography apparatus constituting an embodiment of the invention.

Throughout the following description identical reference numerals will be used to identify like parts.

Referring to FIG. 1, a semiconductor wafer 100 having layers of photosensitive material disposed thereon (not shown in FIG. 1), the layers of photosensitive material having an upper surface 102, is disposed upon a substrate stage (not shown) of an immersion lithography apparatus arranged to carry the wafer 100. In this example, the immersion lithography apparatus is a modified TWINSCAN™ XT:1250i lithography scanner available from ASML. The lithography scanner is a complex apparatus having many parts, the structure and operation of which, are not directly relevant to the embodiments disclosed herein. Consequently, for the sake of clarity and conciseness of description, only the parts of the lithography scanner of particular relevance to the embodiment described herein will be described.

The immersion lithography apparatus comprises an optical exposure (projection or catadioptric) system 104 connected to a liquid delivery unit 106, sometimes known as a "showerhead". A so-called immersion liquid 107 is disposed between the bottom of the optical exposure system 104 and the surface 102 of the layers of photosensitive material.

The liquid delivery unit 106 comprises immersion liquid inlet/outlet ports 108 in fluid communication with a reservoir 109 defined by an inner peripheral surface 110 of the liquid delivery unit 106 and the upper surface 102. A source of a barrier liquid 112 is coupled to barrier liquid inlet\outlet ports 114. A vacuum pump (not shown) is coupled to vacuum ports 116, the vacuum ports 116 being in fluid communication with a first channel loop 118. A compressor (not shown) is coupled to air supply ports 120, the air supply ports 120 being in fluid communication with a second channel loop 122.

In operation, a quantity of an immersion liquid 107 is delivered to the reservoir 109 via the immersion liquid inlet/outlet ports 108, a layer 111 of the immersion liquid 107 lying between the surface 102 and the liquid delivery unit 106. The immersion liquid 107 is a high refractive index (high-n) liquid having a refractive index between about 1.5 and about 1.8, i.e. greater than the refractive index of water, for example between about 1.6 and 1.7. In this example, the immersion liquid 107 is Dupont® IF132 having a refractive index of close to 1.65. However, the skilled person will appreciate that liquids having a lower refractive index, for example water, can be used.

Figure 2:
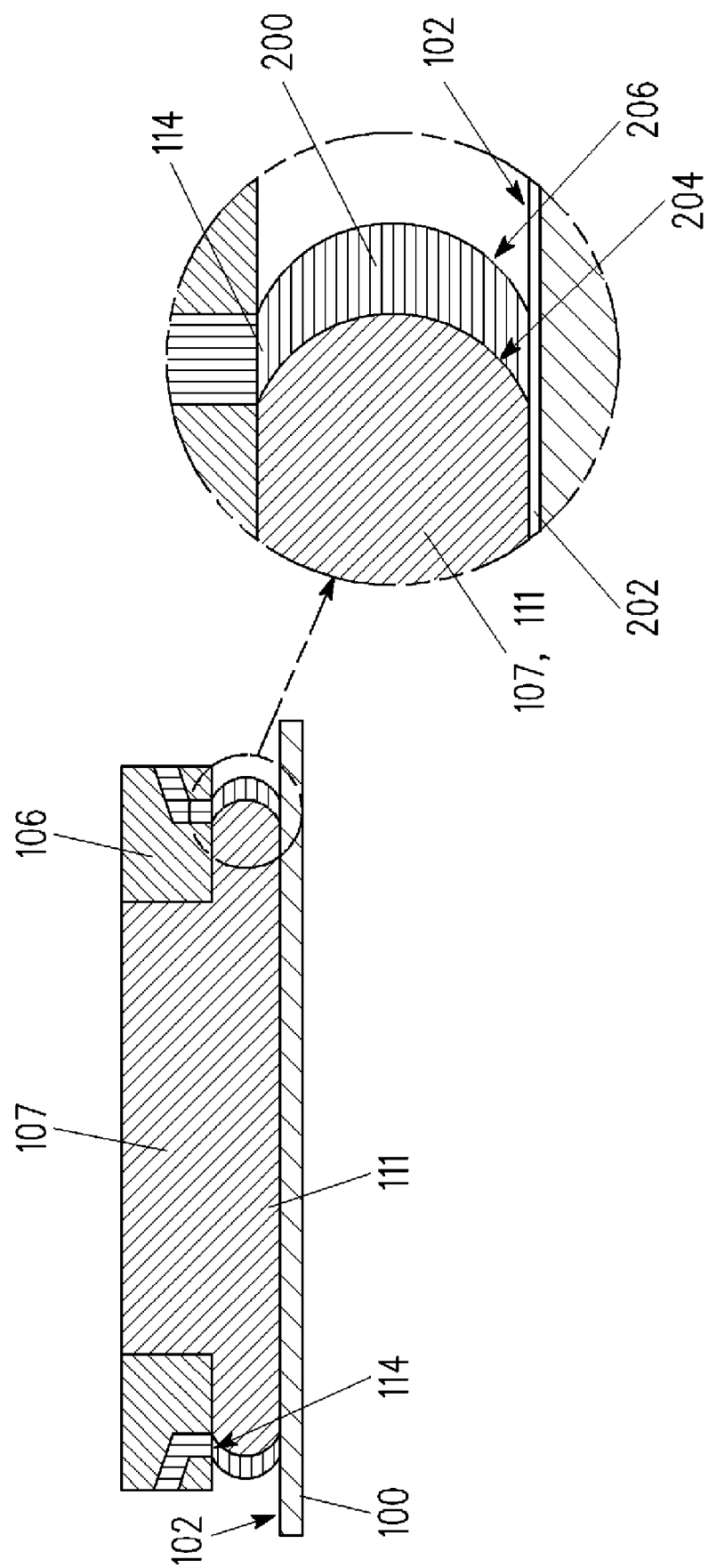
FIG. 2 is a schematic diagram of a part of the liquid delivery unit of FIG. 1, but in greater detail.

Turning to FIG. 2, a quantity of the barrier liquid 200 is deposited adjacent the layer 111 of the immersion liquid 107 as an annulus, in this example, to surround the layer 111 of the immersion liquid 107 and "cap" the layer 111 of the immersion liquid 107. The barrier liquid 200 is, in this example, an aqueous-based liquid. However, the skilled person will appreciate that the barrier liquid 200 can be non-aqueous-based. The barrier liquid 200 has a density of a value so that the barrier liquid 200 does not mix with the immersion liquid 107 during translation of the wafer 100 relative to the liquid delivery unit 106. The density of the barrier liquid 200 can be greater than that of the immersion liquid 107. The density of the barrier liquid 200 can be between about 700 kgm$^{-3}$ and about 1600 kgm$^{-3}$, for example oil or dodecane. The density of the barrier liquid 200 can be between about 800 kgm$^{-3}$ and about 1500 kgm$^{-3}$. In this example, the barrier liquid 200 is dodecane and has a density of about 750 kgm$^{-3}$ at 25° C. In this example, the barrier liquid 200 is also hydrophobic, though the skilled person will appreciate that hydrophilic liquids can be used.

The optical exposure system 104 coupled to the liquid delivery unit 106 scans the surface 102 of the layers of photosensitive material 202 by translation of the wafer beneath the optical exposure system 104 in order to project a pattern onto the layers of photosensitive material 202 in a manner known for the lithography scanner. A vacuum provided to the first channel loop 114 via the vacuum ports 112 and pressurised air expelled into the second channel loop 118 via the air supply ports 116 prevent egress of the immersion liquid 107 and the barrier liquid 200 through a clearance 126 between the liquid delivery unit 106 and the surface 102, thereby serving as a seal and a means of preventing spurious deposition of the immersion liquid 107 and the barrier liquid 200 on the surface 102.

Whilst the layer 111 of the immersion liquid 107 moves relative to the surface 102 of the wafer 100, a first exterior edge or front 204 of the layer 111 of the immersion liquid 107 "rolls" in a direction of travel of the layer 111 of the immersion liquid 107 relative to the surface 102 of the wafer 100. The annular quantity of the barrier liquid 200 also moves relative to the surface 102 of the wafer 100 with the layer 111 of the immersion liquid 107. Independently of the first exterior surface 204, a second exterior edge or front 206 of the barrier liquid 200 also rolls in the direction of travel of the layer 111 of the immersion liquid 107 relative to the surface 102 of the wafer 100.

As a result of the presence of the barrier liquid 200 surrounding the layer 111 of the immersion liquid 107, the immersion liquid 107 is isolated from environmental gases, for example oxygen, that are usually present in an atmosphere in which the scanner is disposed. Additionally, the provision of the barrier liquid 200 also prevents the layer 111 of the immersion liquid 107 from enveloping quantities of the environmental gases.

It is thus possible to provide an immersion lithography apparatus and a method of performing immersion lithography that prevents absorption of oxygen by the immersion liquid. Additionally, the formation of bubbles in the immersion liquid is mitigated at elevated scanning rates, for example above 500 mms$^{-1}$. Of course, the above advantages are exemplary, and these or other advantages may be achieved by the invention. Further, the skilled person will appreciate that not all advantages stated above are necessarily achieved by embodiments described herein.

It should be appreciated that quoted refractive indices herein are quoted with respect to a given wavelength of electromagnetic radiation, for example 193 nm.

The invention claimed is:

1. An immersion lithography apparatus comprising:
   an optical system for projecting a pattern onto a part of a surface of a wafer, the optical system having a liquid delivery unit arranged to dispose, when in use, a quantity of an immersion liquid for filling a space between the optical system and the surface of the wafer, the liquid delivery unit having a lower horizontal surface defining a clearance between the lower horizontal surface and the surface of the wafer, the liquid delivery unit including a first port for deploying the quantity of the immersion liquid and including a second port for deploying a quantity of a barrier liquid, the second port to dispense into the clearance;
   a carrier unit for carrying the wafer, the carrier unit being arranged to move, when in use, relative to the optical system for exposing different parts of the surface of the wafer to the pattern; and
   a source of the barrier liquid arranged to provide through the second port, when in use, the quantity of the barrier liquid adjacent and in contact with the quantity of the immersion liquid, thereby preventing ingress to the quantity of the immersion liquid of a gas external to the quantity of the barrier liquid, wherein the barrier liquid is hydrophobic and non-aqueous and has a density between about 700 kgm$^{-3}$ and about 1600 kgm$^{-3}$.

2. An apparatus as claimed in claim 1, wherein the quantity of the immersion liquid has a leading edge when the carrier unit moves relative to the optical system, the quantity of the barrier liquid being disposed adjacent the leading edge of the quantity of the immersion liquid.

3. An apparatus as claimed in claim 1, wherein the refractive index of the immersion liquid is between about 1.5 and about 1.8.

4. An apparatus as claimed in claim 1, wherein the refractive index of the immersion liquid is between about 1.6 and about 1.7.

5. An apparatus as claimed in claim 1, wherein a density of the barrier liquid is of a value so that, when in use, the barrier liquid does not mix with the immersion liquid during the relative movement of the carrier unit.

6. An apparatus as claimed in claim 1, wherein the immersion liquid rolls, when in use, and the quantity of barrier liquid prevents envelopment of the gas by the quantity of the immersion liquid as the immersion liquid rolls.

7. A method of performing immersion lithography, the method comprising the steps of:
   disposing a quantity of an immersion liquid to fill a space between an optical system of an immersion lithography apparatus and a surface of a wafer, the optical system having a liquid delivery unit arranged to dispose, when in use, a quantity of the immersion liquid for filling the space between the optical system and the surface of the wafer, the liquid delivery unit having a lower horizontal surface defining a clearance between the lower horizontal surface and the surface of the wafer, the liquid delivery unit including a first port for deploying the quantity of the immersion liquid and including a second port for deploying a quantity of a barrier liquid, the second port to dispense into the clearance;
   projecting a pattern onto a part of the surface of the wafer;
   moving the wafer relative to the optical system for exposing different parts of the surface of the wafer to the pattern;
   providing the quantity of the barrier liquid adjacent and in contact with the quantity of the immersion liquid, thereby preventing ingress to the quantity of the immersion liquid of a gas external to the quantity of the barrier liquid, wherein the barrier liquid is hydrophobic and non-aqueous and has a density between about 700 kgm$^{-3}$ and about 1600 kgm$^{-3}$.

8. An apparatus as claimed in claim 2, wherein the refractive index of the immersion liquid is between about 1.5 and about 1.8.

9. An apparatus as claimed in claim 2, wherein the refractive index of the immersion liquid is between about 1.6 and about 1.7.

10. An apparatus as claimed in claim 2, wherein a density of the barrier liquid is of a value so that, when in use, the barrier liquid does not mix with the immersion liquid during the relative movement of the carrier unit.

11. An apparatus as claimed in claim 3, wherein a density of the barrier liquid is of a value so that, when in use, the barrier liquid does not mix with the immersion liquid during the relative movement of the carrier unit.

12. An apparatus as claimed in claim 4, wherein a density of the barrier liquid is of a value so that, when in use, the barrier liquid does not mix with the immersion liquid during the relative movement of the carrier unit.

13. An apparatus as claimed in claim 1, wherein the barrier liquid comprises dodecane.

14. A method of performing immersion lithography as claimed in claim 7, wherein the barrier liquid is dodecane.

15. An immersion lithography apparatus comprising:
   an optical system for projecting a pattern onto a part of a surface of a wafer, the optical system having a liquid delivery unit arranged to dispose, when in use, a quantity of an immersion liquid for filling a space between the optical system and the surface of the wafer;
   a carrier unit for carrying the wafer, the carrier unit being arranged to move, when in use, relative to the optical system for exposing different parts of the surface of the wafer to the pattern; and
   a source of the barrier liquid arranged to provide through the second port, when in use, a quantity of the barrier liquid adjacent and in contact with the quantity of the immersion liquid, thereby preventing ingress to the quantity of the immersion liquid of a gas external to the quantity of the barrier liquid when the carrier unit moves relative to the optical system at a rate above 500 mm/s, wherein the barrier liquid is hydrophobic and non-aqueous and has a density between about 700 kgm$^{-3}$ and about 1600 kgm$^{-3}$.

16. The immersion lithography apparatus of claim 15, wherein the barrier liquid is dodecane.

17. The immersion lithography apparatus of claim 15, wherein the barrier liquid is oil.

18. An apparatus as claimed in claim 1, wherein the barrier liquid comprises oil.

19. A method of performing immersion lithography as claimed in claim 7, wherein the barrier liquid is oil.

20. An apparatus as claimed in claim 1, wherein the immersion liquid is aqueous.

* * * * *